(12) United States Patent
Wang et al.

(10) Patent No.: US 10,867,544 B2
(45) Date of Patent: Dec. 15, 2020

(54) PIXEL STRUCTURE, ARRAY SUBSTRATE AND DISPLAY PANEL HAVING A CURVED GAP BETWEEN ADJACENT SUB PIXELS

(71) Applicants: Hefei Xinsheng Optoelectronics Technology Co., Ltd., Hefei (CN); BOE TECHNOLOGY GROUP CO., LTD., Beijing (CN)

(72) Inventors: Qinghe Wang, Beijing (CN); Xueguang Hao, Beijing (CN); Dacheng Zhang, Beijing (CN); Yongda Ma, Beijing (CN); Dongfang Wang, Beijing (CN); Liangchen Yan, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/399,737

(22) Filed: Apr. 30, 2019

(65) Prior Publication Data
US 2020/0184874 A1    Jun. 11, 2020

(30) Foreign Application Priority Data
Dec. 11, 2018    (CN) .......................... 2018 1 1510338

(51) Int. Cl.
*G09G 3/20* (2006.01)
*G02F 1/1362* (2006.01)
(Continued)

(52) U.S. Cl.
CPC ..... *G09G 3/2003* (2013.01); *G02F 1/136286* (2013.01); *G09G 3/3607* (2013.01);
(Continued)

(58) Field of Classification Search
CPC .... G09G 3/2003; G09G 3/364; G09G 3/3607; G09G 3/3225; G09G 2300/0465;
(Continued)

(56) References Cited

U.S. PATENT DOCUMENTS 8,159,644 B2 * 4/2012 Takatori ................. H05B 47/00
                                                      349/146
8,681,090 B2 * 3/2014 Miyashita ............... G02F 1/167
                                                      345/107

(Continued)

*Primary Examiner* — Darlene M Ritchie
(74) *Attorney, Agent, or Firm* — Thomas | Horstemeyer LLP

(57) ABSTRACT

A pixel structure includes at least three sub-pixels and there is a gap between two adjacent sub-pixels. The gap includes at least a first gap and a second gap, where the first gap extends along a linear trajectory and the second gap extends along a curved trajectory. The wire includes at least a first wire and a second wire, wherein the first wire passes through the first gap along the linear trajectory and is spaced apart from the sub-pixels on both sides of the first gap, and the second wire passes through the second gap along the curved trajectory and is spaced apart from the sub-pixels on both sides of the second gap. The second wire has a line width larger than a line width of the first wire.

15 Claims, 2 Drawing Sheets

(51) Int. Cl.
  *G09G 3/36*     (2006.01)
  *G09G 3/3225*   (2016.01)
  *H01L 27/12*    (2006.01)
  *H01L 27/32*    (2006.01)

(52) U.S. Cl.
  CPC ........ *H01L 27/124* (2013.01); *H01L 27/3276* (2013.01); *G02F 2201/52* (2013.01); *G09G 3/3225* (2013.01); *G09G 2300/0452* (2013.01); *G09G 2300/0465* (2013.01); *G09G 2330/045* (2013.01)

(58) Field of Classification Search
  CPC ..... G09G 2300/0452; G09G 2330/045; G09G 3/20; G09G 2300/043; H01L 27/124; H01L 27/3276; G02F 1/1362; G02F 1/13452; G02F 1/136286; G02F 2201/52; G02F 2001/134345
  See application file for complete search history.

(56) References Cited

U.S. PATENT DOCUMENTS

| | | | |
|---|---|---|---|
| 2007/0070262 A1* | 3/2007 | Hung | G02F 1/136286 349/43 |
| 2008/0129944 A1* | 6/2008 | Park | G02F 1/1345 349/150 |
| 2008/0231165 A1* | 9/2008 | Lee | H01L 27/3276 313/495 |
| 2009/0225267 A1* | 9/2009 | Atarashiya | G02F 1/1368 349/139 |
| 2011/0317250 A1* | 12/2011 | Kimura | G02F 1/167 359/296 |
| 2015/0185564 A1* | 7/2015 | Konno | G02F 1/134363 349/43 |
| 2017/0031217 A1* | 2/2017 | Jung | G02F 1/134363 |
| 2017/0146869 A1* | 5/2017 | Hirosawa | G02F 1/13394 |
| 2017/0186836 A1* | 6/2017 | Tada | H01L 27/3248 |
| 2019/0219876 A1* | 7/2019 | Lin | G02F 1/133512 |

* cited by examiner

PIXEL STRUCTURE, ARRAY SUBSTRATE AND DISPLAY PANEL HAVING A CURVED GAP BETWEEN ADJACENT SUB PIXELS

CROSS-REFERENCE TO RELATED APPLICATIONS

The present application claims the benefit of and priority to Chinese Patent Application No. 201811510338.6 filed Dec. 11, 2018, the entire contents of which are incorporated herein by reference.

TECHNICAL FIELD

The present disclosure relates to the field of display technologies and, more particularly, to a pixel structure, an array substrate, and a display panel.

BACKGROUND

In recent years, with the rapid development of display technologies, significant progress has been made in research on various types of displays such as LCDs (Liquid Crystal Display) and OLEDs (Organic Light Emitting Diode). A variety of wires are arranged in a pixel structure of various displays to turn on a power supply, transmit a scan signal and a data signal, etc. In existing technologies, heat generation of various regions of a display are not uniform, which results in a poor image quality and also reduces a service life of the display.

The foregoing information disclosed in Background are only for the purpose of enhancement of the understanding of the background of the present disclosure and therefore the information can include information that does not constitute the existing technology already known to those of ordinary skill in the art.

SUMMARY

According to a first aspect of the present disclosure, a pixel structure is provided, including:

at least three sub-pixels having a gap between two adjacent sub-pixels, the gap including at least a first gap which extends along a linear trajectory and a second gap which extends along a curved trajectory;

a plurality of wires including at least a first wire and a second wire, the first wire passing through the first gap along the linear trajectory and being spaced apart from the sub-pixels on both sides of the first gap, the second wire passing through the second gap along the curved trajectory and being spaced apart from the sub-pixels on both sides of the second gap, and the second wire having a line width greater than that of the first wire.

In an example embodiment of the present disclosure, the first wire has a thickness equal to a thickness of the second wire, and the line width $d_2$ of the second wire and the line width $d_1$ of the first wire satisfy a preset formula:

$$d_2 = \frac{L_2}{L_1} d_1$$

Where $L_1$ is a length of the first wire and $L_2$ is a length of the second wire.

In an example embodiment of the present disclosure, the line width $d_1$ of the first wire is 3 to 10 μm.

In an example embodiment of the present disclosure, there are one or more first wires passing through one of the first gaps and there are one or more second wires passing through one of the second gaps.

In an example embodiment of the present disclosure, the pixel structure includes one or more units, each of which including a plurality of sub-pixels; the sub-pixels of each of the pixel units include at least a first sub-pixel, a second sub-pixel, a third sub-pixel, and a fourth sub-pixel, which are sequentially arranged and spaced apart from one another in a predetermined direction; a gap between the first sub-pixel and the second sub-pixel is the first gap, a gap between the second sub-pixel and the third sub-pixel is the second gap, and a gap between the third sub-pixel and the fourth sub-pixel is the first gap.

In an example embodiment of the present disclosure, the first sub-pixel is an R sub-pixel, the second sub-pixel is a B sub-pixel, the third sub-pixel is a G sub-pixel, and the fourth sub-pixel is a W sub-pixel.

In an example embodiment of the present disclosure, the second sub-pixel has a protrusion on a side thereof closer to the third sub-pixel and the third sub-pixel has a groove on a side thereof closer to the second sub-pixel, the protrusiton inserting into the groove to form the second gap.

In an example embodiment of the present disclosure, the protrusion extends along a first fold line, the groove extends along a second fold line, the protrusion and the groove are disposed to match one another, and the first fold line and the second fold line are spaced apart from each other to form the second gap.

According to another aspect of the present disclosure, an array substrate is provided which includes the pixel structure according to any of the above-described contents.

According to another aspect of the present disclosure, a display panel is provided which includes the above-described array substrate.

BRIEF DESCRIPTION OF THE DRAWINGS

The accompanying drawings herein which are incorporated into and constitute a part of the description, illustrate the embodiments according to the present disclosure, and serve as explaining the principles of the present disclosure together with the description. Understandably, the drawings in the description below are merely for illustrating some embodiments of the present disclosure, and other drawings may be obtained by those skilled in the art according to these drawings without imposing any creative work.

DETAILED DESCRIPTION

Figure 1:
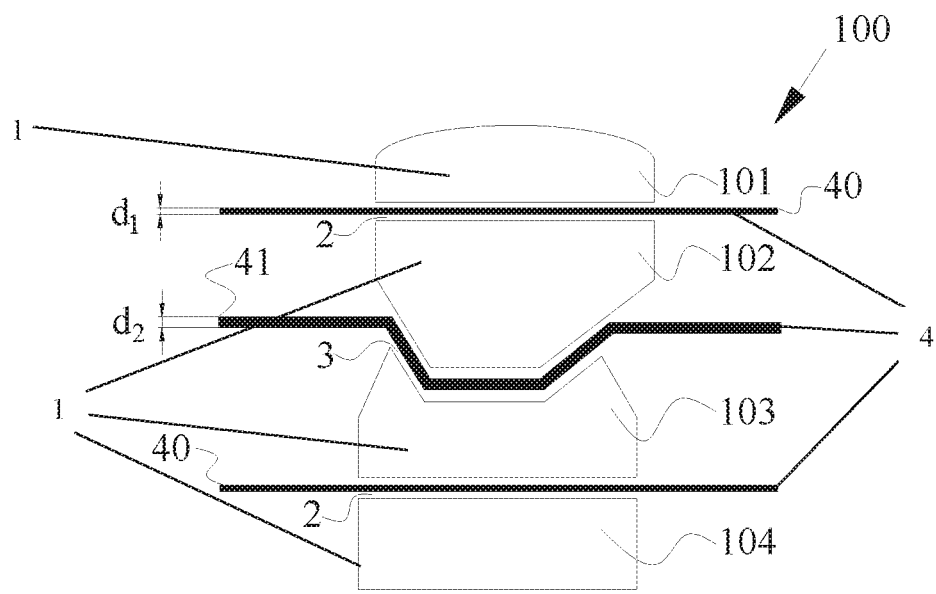
FIG. 1 is a schematic diagram of a pixel structure according to an embodiment of the present disclosure.

The example embodiments will now be described more fully with reference to the accompanying drawings. However, the example embodiments can be implemented in various forms and should not be understood as being limited to the examples set forth herein; rather, these embodiments are provided so that this disclosure will be thorough and complete, and the conception of example embodiments will be fully conveyed to those skilled in the art. The same reference signs in the drawings denote the same or similar structures, and detailed descriptions thereof will be omitted.

Although relative terms such as "upper" and "lower" are used in this specification to describe a relative relationship of one component to another component of an icon, these terms are used in this specification for convenience only, for example, based on a direction of an example illustrated in the accompanying drawings. It will be understood that if a device of the icon is flipped upside down, the "upper" component will become the "lower" component. When one structure is "on" the other structure, this means that the structure is integrally formed on the other structure, or the structure is "directly" disposed on the other structure, or the structure is "indirectly" disposed on the other structure through another structure.

Terms "a", "an", "the", and "said" are used to denote the presence of one or more elements/constituent parts/etc; terms "including" and "having" represent open including and refer to additional elements/constituent parts/etc in addition to the listed elements/constituent parts/etc; terms "first", "second" and "third" are only used as a token, rather than a limit on the number of objects.

In relevant technologies, a display panel has a plurality of sub-pixels distributed in an array and a gap through which a wire passes is disposed between the two adjacent sub-pixels. In order to increase an aperture ratio of the sub-pixel of a specific color without reducing a TFT, that is, to enlarge a display area, the sub-pixel of a specific color may protrude toward the adjacent sub-pixel, such that the gap between the sub-pixel of a specific color and the adjacent sub-pixel extend along a curved trajectory, and a wire passing through the curved gap is also bent correspondingly, which results in an increased length of the wire and an increase in resistance accordingly. For the gap which extends along a linear trajectory, a wire may linearly pass through, thus, a resistance difference of the wires on the display panel is large, and the heat generation of various regions is not uniform, which affects the display effect and the service life of the display panel.

As shown in FIG. 1, an embodiment of the present disclosure provides a pixel structure which can be applied to a display. The display can be an LCD display or an OLED display etc., which will not be enumerated herein. The OLED display is taken as an example in the embodiment of the present disclosure and the pixel structure may include sub-pixels 1 and wires 4.

There are at least three sub-pixels 1 and there is a gap between two adjacent sub-pixels 1. The gap at least includes a first gap 2 which extends along a linear trajectory and a second gap 3 which extends along a curved or non-linear trajectory.

The wires 4 include at least a first wire 40 and a second wire 41. The first wire 40 passes through the first gap 2 along the linear trajectory and is spaced apart from the sub-pixels 1 on both sides of the first gap 2. The second wire 41 passes through the second gap 3 along the curved trajectory and is spaced apart from the sub-pixels 1 on both sides of the second gap 3. The second wire 41 has a line width larger than a line width of the first wire 40.

In the pixel structure provided by the embodiment of the present disclosure, the first gap 2 extends along the linear trajectory and the second gap 3 extends along the curved trajectory, so that the second wire 41, which passes through the second gap 3, has a length greater than a length of the first wire 40 which passes through the first gap 2. The line width of the second wire 41 is larger than that of the first wire 40, which may reduce a difference of resistance values caused by the different lengths of the first wire 40 and the second wire 41 and make the generation of heat of the first wire 40 and the second wire 41 more uniform. Therefore, a display panel will have an increased uniformity of heat generation and improved display effect and extended service life.

Components of the pixel structure provided by the embodiment of the present disclosure will be described in detail below with reference to the accompanying drawings.

As shown in FIG. 1, a plurality of sub-pixels 1 may be provided as constitution units of the pixel structure and the plurality of sub-pixels 1 may be arranged in an array. The sub-pixels 1 may have a regular shape such as a square shape or a rectangle shape, or an irregular shape. There are at least three sub-pixels 1 and there is a gap between two adjacent sub-pixels 1. The gap may include at least a first gap 2 and a second gap 3.

The first gap 2 may extend along a linear trajectory and the second gap 3 may extend along a curved trajectory, which may be a fold line or a curve. The second gap 3 has a length greater than a length of the first gap 2.

For example, a sub-pixel 1 may have a protrusion protruding toward an adjacent sub-pixel 1 and the adjacent sub-pixel 1 may have a groove into which the protrusion protrudes to form a second gap 3 which extends along a curved trajectory. A contour of the protrusion may be a fold line and a shape of the groove matches that of the protrusion. Certainly, the contours of the projection and groove may also be a curve which will not be elaborated here.

In a case where an area of a TFT (Thin Film Transistor) is unchanged, two adjacent sub-pixels 1 on both sides of the second gap 3 have a larger aperture ratio, so that a light exiting area of the two sub-pixels 1 can be ensured and a light transmittance of the sub-pixels 1 is compensated.

Figure 3:
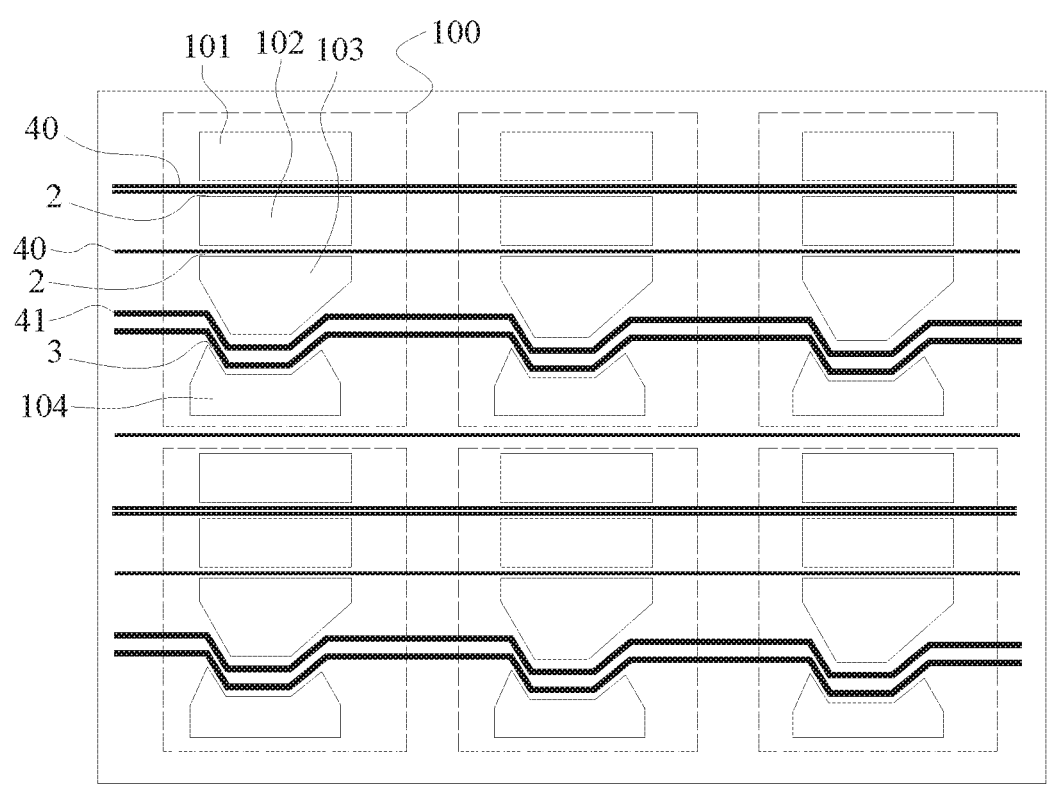
FIG. 3 is a schematic view of an array substrate according to an embodiment of the present disclosure.

As shown in FIGS. 1 and 3, the pixel structure of the present disclosure may include at least one pixel unit 100, each of which includes a plurality of sub-pixels 1.

In an embodiment, there may be four sub-pixels 1 in one pixel unit 100 and the four sub-pixels 1 are arranged and spaced apart from one another in a predetermined direction and are respectively a first sub-pixel 101, a second sub-pixel 102, a third sub-pixel 103 and a fourth sub-pixel 104. The first sub-pixel 101 and the fourth sub-pixel 104 are disposed on the outer side of the pixel unit 100 and the second sub-pixel 102 and the third sub-pixel 103 are disposed between the first sub-pixel 101 and the fourth sub-pixel 104. The second sub-pixel 102 is disposed adjacent to the first sub-pixel 101 and the third sub-pixel 103 is disposed adjacent to the fourth sub-pixel 104.

A first gap 2 is formed between the first sub-pixel 101 and the second sub-pixel 102, a second gap 3 is formed between the second sub-pixel 102 and the third sub-pixel 103, and a first gap 2 is formed between the third sub-pixel 103 and the fourth sub-pixel 104.

The sub-pixels 1 in the pixel unit 100 have various colors and the sub-pixels 1 of different colors may include a cathode, an anode, and an electroluminescent layer, which is interposed between the cathode and the anode to emit light of a predetermined color.

The first sub-pixel 101 is an R sub-pixel, the second sub-pixel 102 is a B sub-pixel, the third sub-pixel 103 is a G sub-pixel, and the fourth sub-pixel 104 is a W sub-pixel.

Figure 2:
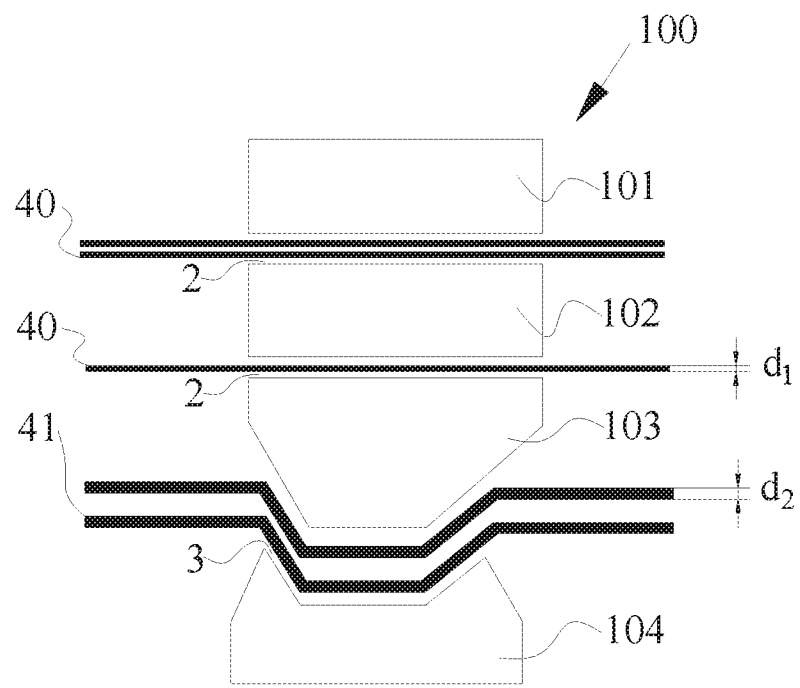
FIG. 2 is a schematic diagram of a pixel structure according to another embodiment of the present disclosure.

As shown in FIG. 2, in another embodiment of the present disclosure, the first sub-pixel 101 may be an R sub-pixel, the second sub-pixel 102 may be a W sub-pixel, the third sub-pixel 103 may be a B sub-pixel, and the fourth sub-pixel 104 may be a G sub-pixel.

The first gap 2 may be formed between the first sub-pixel 101 and the second sub-pixel 102, and between the second sub-pixel 102 and the third sub-pixel 103, and the second gap 3 may be formed between the third sub-pixel 103 and the fourth sub-pixel 104.

As shown in FIG. 1, the wire 4 may be a data line, a signal line, etc., which will not be elaborated herein. A cross-sectional area of the wire 4 may be a rectangle, a trapezoid or a triangle, etc., which will not be enumerated herein. There are a plurality of wires 4 which may include at least the first wire 40 and the second wire 41.

The first wire 40 passes through the first gap 2 along the linear trajectory and is spaced apart from the sub-pixels 1 on both sides of the first gap 2 and the second wire 41 passes through the second gap 3 along the curved trajectory and is spaced apart from the sub-pixels 1 on both sides of the second gap 3. The first wire 40 and the second wire 41 may be disposed on the same layer and they have the same material and thickness and may be formed by single mask processing.

The manufacturing of the pixel structure should not be affected by a specific value of spacing between the first wire 40 and each of the sub-pixels 1 and between the second wire 41 and each of the sub-pixels 1, which will not be particularly limited herein.

There may be one or more first wires 40 passing through one first gap 2 and there may be one or more second wires 41 passing through one second gap 3, which will not particularly limited herein.

In order to improve the uniformity of heat generation of the first wire 40 and the second wire 41, it is necessary to reduce the difference in the resistance values of the first wire 40 and the second wire 41 as much as possible. Therefore, in the case where the first wire 40 and the second wire 41 have the same material and thickness, the resistance values of the first wire 40 and the second wire 41 are equalized and the line width of the second wire 41 and the line width of the first wire 40 are calculated.

For example, the first wire 40 and the second wire 41 are made of the same material and their cross-sections may be a trapezoid, and the cross sections are calculated by Equation:

$$S = \frac{(a+b) \times h}{2}$$

Where a is a width of an upper side of the trapezoid, b is a width of a lower side of the trapezoid, and h is a height of the trapezoid (the thickness of the wire 4).

It should be understood that if $d=0.5\times(a+b)$, then $S=d\times h$, in order that the resistance values of the first wire 40 and the second wire 41 are the same, it can be deduced that the line width $d_2$ of the second wire 41 and the line width $d_1$ of the first wire 40 satisfy the following preset Equation:

$$d_2 = \frac{L_2}{L_1} d_1$$

Where $L_1$ is the length of the first wire 40 and $L_2$ is the length of the second wire 41.

In the case where the length and width of the first wire 40 are known, the line width of the second wire 41 can be calculated based on the preset equation described above. The line width $d_1$ of the first wire 40 may range from 3 μm to 10 μm, or may be less than 3 μm or more than 10 μm.

As shown in FIG. 3, an embodiment of the present disclosure further provides an array substrate including the pixel structure according to any of the above-described contents and there may be a plurality of pixel structures.

An embodiment of the present disclosure also provides a display panel including the above-described array substrate. For example, the display panel may be an LCD display panel or an OLED display panel and may be applied to products such as computers, mobile phones, which will not be enumerated here.

It should be understood that the present disclosure is not limited to a detailed structure and arrangement of components presented in this specification. The present disclosure can have other embodiments and can be implemented and carried out in various manners. The foregoing variations and modifications fall into the scope of the present disclosure. It is understood that the disclosure disclosed and defined in this specification extends to all alternative combinations of two or more individual features that are mentioned or apparent in the text and/or the drawings. All of these different combinations constitute a number of alternative aspects of the present disclosure. The embodiments described in the specification are illustrative of the best mode for carrying out the present disclosure and will enable those skilled in the art to utilize the present disclosure.

The invention claimed is:

1. A pixel structure, comprising:
at least three sub-pixels having a gap between two adjacent sub-pixels, the gap comprising at least a first gap which extends along a linear trajectory and a second gap which extends along a curved trajectory; and
a plurality of wires comprising at least a first wire and a second wire, the first wire passing through the first gap along the linear trajectory and being spaced apart from the sub-pixels on both sides of the first gap, the second wire passing through the second gap along the curved trajectory and being spaced apart from the sub-pixels on both sides of the second gap, and the second wire having a line width greater than that of the first wire;
wherein the pixel structure comprises one or more units each of which comprising a plurality of sub-pixels, the sub-pixels of each of the one or more pixel units comprising at least a first sub-pixel, a second sub-pixel, a third sub-pixel, and a fourth sub-pixel that are sequentially arranged and spaced apart from one another in a predetermined direction;
wherein a gap between the first sub-pixel and the second sub-pixel is the first gap, a gap between the second sub-pixel and the third sub-pixel is the second gap, and a gap between the third sub-pixel and the fourth sub-pixel is the first gap; and
wherein the second sub-pixel has a protrusion on a side thereof closer to the third sub-pixel, and the third sub-pixel has a groove on a side thereof closer to the second sub-pixel, the protrusion inserting into the groove to form the second gap.

2. The pixel structure according to claim 1, wherein there are one or more first wires passing through one of the first gaps and there are one or more second wires passing through one of the second gaps.

3. The pixel structure according to claim 1, wherein the first sub-pixel is an R sub-pixel, the second sub-pixel is a B sub-pixel, the third sub-pixel is a G sub-pixel, and the fourth sub-pixel is a W sub-pixel.

4. The pixel structure according to claim 1, wherein the protrusion extends along a first fold line, the groove extends along a second fold line, the protrusion and the groove are disposed to match one another, and the first fold line and the second fold line are spaced apart from each other to form the second gap.

5. The pixel structure according to claim 1, wherein the first wire has a thickness equal to a thickness of the second wire, and the line width $d_2$ of the second wire and the line width $d_1$ of the first wire satisfy a preset formula:

$$d_2 = \frac{L_2}{L_1} d_1,$$

where $L_1$ is a length of the first wire and $L_2$ is a length of the second wire.

6. The pixel structure according to claim 5, wherein the line width $d_1$ of the first wire is 3 to 10 μm.

7. An array substrate comprising a pixel structure, the pixel structure comprising:
   at least three sub-pixels having a gap between two adjacent sub-pixels, the gap comprising at least a first gap which extends along a linear trajectory and a second gap which extends along a curved trajectory; and
   a plurality of wires comprising at least a first wire and a second wire, the first wire passing through the first gap along the linear trajectory and being spaced apart from the sub-pixels on both sides of the first gap, the second wire passing through the second gap along the curved trajectory and being spaced apart from the sub-pixels on both sides of the second gap, and the second wire having a line width greater than that of the first wire;
   wherein the pixel structure comprises one or more units each of which comprising a plurality of sub-pixels, the sub-pixels of each of the one or more pixel units comprising at least a first sub-pixel, a second sub-pixel, a third sub-pixel, and a fourth sub-pixel that are sequentially arranged and spaced apart from one another in a predetermined direction;
   wherein a gap between the first sub-pixel and the second sub-pixel is the first gap, a gap between the second sub-pixel and the third sub-pixel is the second gap, and a gap between the third sub-pixel and the fourth sub-pixel is the first gap; and
   wherein the second sub-pixel has a protrusion on a side thereof closer to the third sub-pixel, and the third sub-pixel has a groove on a side thereof closer to the second sub-pixel, the protrusion inserting into the groove to form the second gap.

8. The array substrate according to claim 7, wherein there are one or more first wires passing through one of the first gaps and there are one or more second wires passing through one of the second gaps.

9. The array substrate according to claim 7, wherein the first sub-pixel is an R sub-pixel, the second sub-pixel is a B sub-pixel, the third sub-pixel is a G sub-pixel, and the fourth sub-pixel is a W sub-pixel.

10. The array substrate according to claim 7, wherein the protrusion extends along a first fold line, the groove extends along a second fold line, the protrusion and the groove are disposed to match one another, and the first fold line and the second fold line are spaced apart from each other to form the second gap.

11. The array substrate according to claim 7, wherein the first wire has a thickness equal to a thickness of the second wire, and the line width $d_2$ of the second wire and the line width $d_1$ of the first wire satisfy a preset formula:

$$d_2 = \frac{L_2}{L_1} d_1,$$

where $L_1$ is a length of the first wire and $L_2$ is a length of the second wire.

12. The array substrate according to claim 11, wherein the line width $d_1$ of the first wire is 3 to 10 μm.

13. A display panel comprising an array substrate having a pixel structure, the pixel structure comprising:
   at least three sub-pixels having a gap between two adjacent sub-pixels, the gap comprising at least a first gap which extends along a linear trajectory and a second gap which extends along a curved trajectory; and
   a plurality of wires comprising at least a first wire and a second wire, the first wire passing through the first gap along the linear trajectory and being spaced apart from the sub-pixels on both sides of the first gap, the second wire passing through the second gap along the curved trajectory and being spaced apart from the sub-pixels on both sides of the second gap, and the second wire having a line width greater than that of the first wire;
   wherein the pixel structure comprises one or more units each of which comprising a plurality of sub-pixels, the sub-pixels of each of the one or more pixel units comprising at least a first sub-pixel, a second sub-pixel, a third sub-pixel, and a fourth sub-pixel that are sequentially arranged and spaced apart from one another in a predetermined direction;
   wherein a gap between the first sub-pixel and the second sub-pixel is the first gap, a gap between the second sub-pixel and the third sub-pixel is the second gap, and a gap between the third sub-pixel and the fourth sub-pixel is the first gap; and
   wherein the second sub-pixel has a protrusion on a side thereof closer to the third sub-pixel, and the third sub-pixel has a groove on a side thereof closer to the second sub-pixel, the protrusion inserting into the groove to form the second gap.

14. The display panel according to claim 13, wherein the first wire has a thickness equal to a thickness of the second wire, and the line width $d_2$ of the second wire and the line width $d_1$ of the first wire satisfy a preset formula:

$$d_2 = \frac{L_2}{L_1} d_1,$$

where $L_1$ is a length of the first wire and $L_2$ is a length of the second wire.

15. The display panel according to claim 14, wherein the line width $d_1$ of the first wire is 3 to 10 μm.

* * * * *